(12) United States Patent
Tran et al.

(10) Patent No.: US 6,472,860 B1
(45) Date of Patent: Oct. 29, 2002

(54) COMPENSATED RF POWER DETECTOR

(75) Inventors: Kim Anh Tran, Garland; Chia-sam Wey, Arlington; Jukka-pekka Neitiniemi, Irving, all of TX (US)

(73) Assignee: Nokia Networks Oy, Espoo (FI)

( * ) Notice: Subject to any disclaimer, the term of this patent is extended or adjusted under 35 U.S.C. 154(b) by 0 days.

(21) Appl. No.: 09/532,062

(22) Filed: Mar. 21, 2000

(51) Int. Cl.$^7$ ............................................. G01R 19/00
(52) U.S. Cl. ........................ 324/76.11; 324/537; 702/58
(58) Field of Search ................................ 324/648, 119, 324/76.11, 537, 500; 327/351; 455/341; 329/370; 702/58, 61

(56) References Cited

U.S. PATENT DOCUMENTS

| | | | | |
|---|---|---|---|---|
| 4,003,060 A | * | 1/1977 | Broce | |
| 4,687,622 A | * | 8/1987 | Longden | |
| 4,758,793 A | * | 7/1988 | Sheade | |
| 5,457,436 A | * | 10/1995 | Nishida | |
| 5,659,253 A | * | 8/1997 | Busking | |
| 5,724,003 A | * | 3/1998 | Jensen | |
| 5,844,378 A | * | 12/1998 | Locascio | |
| 5,969,561 A | * | 10/1999 | McGillan | |
| 6,122,085 A | * | 9/2000 | Bitler | |
| 6,204,727 B1 | * | 3/2001 | Wey | |

* cited by examiner

*Primary Examiner*—Michael J. Sherry
*Assistant Examiner*—Trung Nguyen
(74) *Attorney, Agent, or Firm*—Thomas B. Hayes

(57) ABSTRACT

A compensated RF power detector utilized in power control circuits for preventing power amplifier saturation. A power amplifier uses a power control circuit to maintain the power amplifier as efficiently and linearly as possible without distortion. The operating point of the power amplifier is defined as close to the 1 dB gain compression point as possible for maximum efficiency and linearity with minimum distortion. However, extreme temperature conditions affect the 1 dB gain compression point causing the power amplifier to operate too close to saturation resulting in distortion or spectral growth. In an embodiment, the compensated RF power detector comprises a RF power detector and a variable RC circuit. The RF power detector has a RF input for receiving RF power, a detector output for supplying a compensated detected voltage and, a detecting diode for generating a detected voltage in response to the received RF power. The detecting diode has an anode coupled to the RF input and a cathode coupled to the detector output. The variable RC circuit comprises a capacitor and a control circuit. The capacitor has a first lead coupled to the cathode of the detecting diode and a second lead coupled to the control circuit. The control circuit has a control output containing a varying resistance coupled to the second lead of the capacitor. The variations in the varying resistance result in the compensation of the detected voltage.

8 Claims, 2 Drawing Sheets

COMPENSATED RF POWER DETECTOR

FIELD OF THE INVENTION

The present invention relates, in general, to RF power detectors used in power control circuits and, in particular, to a method and apparatus for preventing power amplifier saturation.

BACKGROUND OF THE INVENTION

A wireless communication system, for example, a Global System for Mobile (GSM) system is a standardized system established by the European Telecommunication Standards Institute (ETSI) that defines a common method of communication between a mobile telephone (mobile station) and a base station. The GSM system uses a Time Division Multiple Accessing (TDMA) signaling mode to utilize the available channel frequencies. The TDMA signaling mode defines a carrier frequency comprising eight TDMA channels having eight time slots with each time slot allocated to one mobile station within a geographic area. Each TDMA channel has a time duration of 4.615 ms and each timeslot has a duration of 577 µs. Each time slot carries either speech or control data in a burst form.

The wireless communication system may use an Amplitude Modulation (AM) scheme to modulate the carrier frequency with information. The wireless communication system uses a transmitter to transmit the modulated RF signals and a power amplifier to linearly amplify the modulated RF signal to be transmitted. The amplifier is required to ramp up to a specific power level, transmit the signal containing information, and to ramp down to a specified power level in the defined amount of time in order to avoid interference with an adjacent time slot.

Power amplifiers are biased to operate within the specified constraints with maximum efficiency and linearity. The amplifier's optimized bias point or Q-point should be defined as having a safe zone between the operating point and the 1 dB gain compression point to allow the amplifier to operate as efficiently as possible with minimum distortion. Operating conditions of the power amplifier such as extreme temperature variations affect characteristics of the power amplifier, for example, the power amplifiers 1 dB gain compression point, causing the power amplifier to operate closer to saturation with extreme temperature conditions.

Turning now to FIG. 1, where an exemplary prior art Power Control Loop (PCL) used in wireless communication systems, such as a GSM system, is illustrated and denoted generally as 10. PCL 10 comprises a Power Amplifier (PA) 12 having a amplifier input and a amplifier output coupled to a RF input 14 for receiving RF input power $P_i$ and a RF output 16 for supplying a linearly amplified RF output power $P_o$. A variable attenuator 18 disposed between RF input 14 and PA 12 comprises a input coupled to RF input 14 and a output coupled to the amplifier input. Variable attenuator 18 further comprises a control input 20 for controlling the attenuation level at RF input 14.

PCL 10 further comprises a directional coupler 22 coupled to RF output 16 for coupling a portion, $E_0$, of output power $P_o$ through the feedback path. PCL 10 further comprises a RF power detector 24 for rectifying and linearising coupled power $E_0$. RF power detector 24 comprises a detector input coupled to directional coupler 22 and a detector output containing a detected signal $V_D$. RF power detector 24 may comprise a detector circuit for rectifying the coupled power $E_o$ and a linearizer for logarithmically amplifying detected voltage $V_D$.

PCL 10 further comprises a comparator 30 having an inverting input 32 coupled to detector output containing detected voltage $V_D$ and a non-inverting input coupled to a supply reference terminal 34 containing a supplied reference voltage $V_R$. Supplied reference voltage $V_R$ supplied by an external source such as a Digital Signal Processor or Applications Specific Integrated Circuit (ASIC) is a correct representation output power $P_o$. Comparator 30 compares detected signal $V_D$ and reference signal $V_R$ and supplies the difference, an error signal $V_E$, which is filtered through a loop filter 36. The filtered signal, a control signal $V_C$, adjusts the attenuation level correcting any deviation in output power $P_o$.

Refering now to FIG. 2, where a schematic view of prior art RF power detector 24 is illustrated. RF power detector 24 comprises a detecting diode 50 for rectifying proportional power $E_o$. Detecting diode 50 is coupled to a detector input 52 through a coupling capacitor 54 and a input matching circuit 56. Detecting diode 50 is coupled to a detector output 58 through a lineariser 60. RF power detector 24 further comprises detecting diode 50 coupled to detector output 58 through a lineariser 60. RF power detector 24 further comprises a RC circuit 64 comprising a capacitor 66 coupled in series with a resistor 68. RC circuit 64 is coupled in parallel between lineariser 60 and detecting diode 50. RC circuit may be tuned to control the amount of detected voltage $V_d$ seen across RC circuit 64.

PCL 10 uses negative feedback to control the gain of PA 12 so that PA 12 ramps up, transmits and ramps down within the specified time and with minimum distortion. Error signal $V_E$ is used to adjust the operating point so that output power $P_o$ is maintained within requirements. However, if PA 12 is operating at extreme temperatures, characteristics of PA 12 vary affecting the efficiency and linearity of the device. For example, the 1 dB gain compression decreases causing the margin between the operating point and the 1 dB gain compression point to decrease. Decreasing the margin between the operating point and the 1 dB gain compression point causes the amplifier to operate too close to saturation resulting in distortion and non-linearity which produces spectral growth.

As may be seen an improved apparatus to adjust the operating point of a RF power amplifier according to extreme temperatures could prevent RF power amplifier saturation under extreme temperature conditions.

SUMMARY OF THE INVENTION

The present invention presents an improved apparatus for preventing power amplifier saturation when used in power control circuits.

The invention provides a compensated RF power detector utilized in power control circuits for preventing power amplifier saturation. A power amplifier uses a power control circuit to maintain the power amplifier as efficiently and linearly as possible without distortion. The operating point of the power amplifier is defined as close to the 1 dB gain compression point as possible for maximum efficiency and linearity with minimum distortion. However, extreme temperature conditions affect the 1 dB gain compression point causing the power amplifier to operate too close to saturation resulting in distortion or spectral growth.

In an embodiment, the compensated RF power detector comprises a RF power detector and a variable RC circuit. The RF power detector has an RF input for receiving RF power, a detector output for supplying a compensated detected voltage and, a detecting diode for generating a detected voltage in response to the received RF power. The detecting diode has an anode coupled to the RF input and a cathode coupled to the detector output. The variable RC circuit comprises a capacitor and a control circuit. The capacitor has a first lead coupled to the cathode of the detecting diode and a second lead coupled to the control circuit. The control circuit has a control output containing a varying resistance coupled to the second lead of the capacitor. The variations in the varying resistance result in the compensation of the detected voltage.

In the embodiment, the RF power detector further comprises a coupling capacitor having a first lead coupled to the RF input and a second lead coupled to the anode of the detecting diode. The RF power detector further comprises an input matching circuit disposed between the coupling capacitor and the detecting diode and, a lineariser disposed between the PIN diode and the RF output.

In the embodiment, the control circuit further comprises a PIN diode having an anode and a cathode, with the cathode of the PIN diode coupled to a ground potential and the anode of the PIN diode coupled to the control output. The PIN diode generates the variable resistance at the control output. The control circuit further comprises a bias voltage source coupled to the anode of the PIN diode for supplying a bias current. A temperature dependent resistor is disposed between the PIN diode and the bias voltage source and has a first lead coupled to the bias voltage source and a second lead coupled to the anode of the PIN diode. The resistance of temperature dependent resistor varies across different temperatures and affects the amount of bias current supplied to the PIN diode according to temperature.

In the embodiment, the control circuit comprises a resistor disposed between the temperature dependent resistor and the PIN diode. The control circuit further comprises a capacitor having a first terminal coupled to ground potential and a second terminal coupled between the resistor and the temperature dependent resistor. The control circuit further comprises a inductor disposed between the resistor and the anode of the PIN diode.

In an alternative embodiment, the control circuit comprises a PIN diode having a cathode coupled to ground and a anode coupled to the control output. The PIN diode generates the variable resistance at the control output. The control circuit further comprises a bias voltage source for biasing the diode and an operational amplifier having a output containing a temperature dependent voltage coupled to the anode of the PIN diode through a second resistor. The operational amplifier has a non-inverting input coupled to the bias voltage source through a temperature dependent voltage divider and a inverting input coupled to the temperature dependent output through a third resistor and to ground potential through a fourth resistor.

In the alternate embodiment, the temperature dependent voltage divider further comprises a temperature dependent resistor and a second resistor. The temperature dependent resistor having a first lead coupled to the bias voltage source and a second lead coupled to the inverting input. The second resistor coupled from ground potential to the second lead of temperature dependent resistor.

BRIEF DESCRIPTION OF THE DRAWINGS

For a more complete understanding of the present invention, including its features and advantages, reference is made to the detailed description of the invention, taken in conjunction with the accompanying drawings of which.

DETAILED DESCRIPTION OF THE INVENTION

While the use and implementation of particular embodiments of the present invention are presented in detail below, it will be understood that the present invention provides many inventive concepts, which can be embodied in a wide variety of contexts. The specific embodiments discussed herein are merely illustrative of specific ways to make and use the invention and are not intended to limit the scope of the invention.

Figure 1:
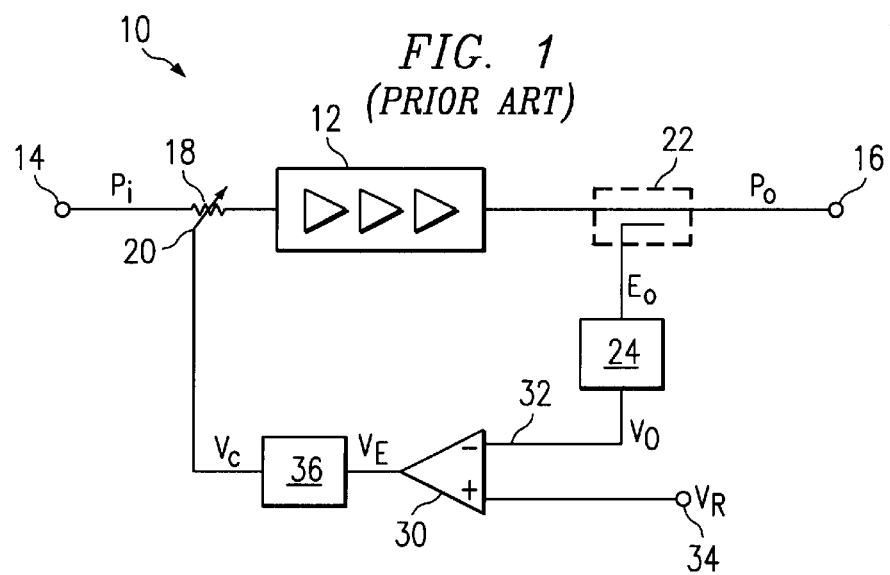
FIG. 1 is a block diagram of a prior art power control loop.
Figure 2:
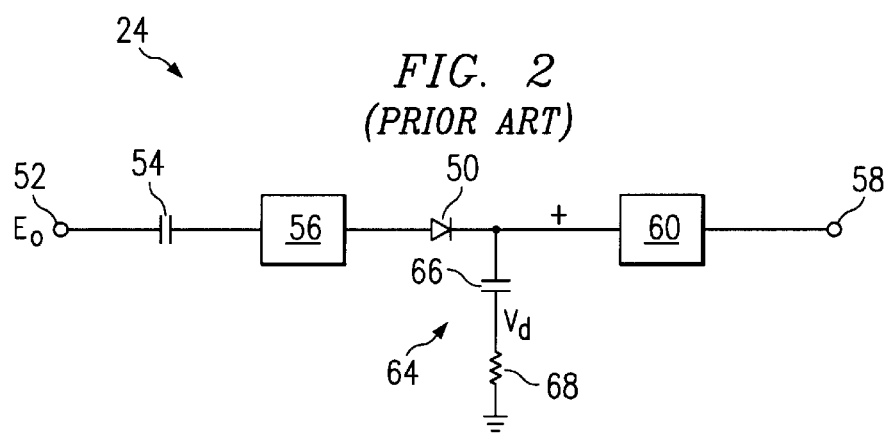
FIG. 2 is a block diagram of a prior art RF power detector.
Figure 3:
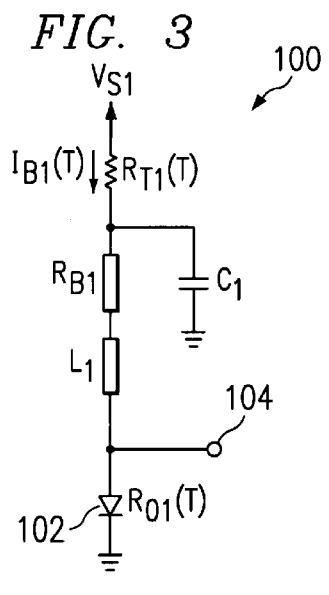
FIG. 3 is a control circuit according to an embodiment of the invention.

Referring now to FIG. 3, therein is illustrated a control circuit 100 according to an embodiment of the invention. Control circuit 100 comprises a PIN diode 102 having a cathode coupled to ground and an anode coupled to a control output 104 and coupled to a voltage source $V_{s1}$ through a Negative Temperature Coefficient (NTC) resistor $R_{T1}$ (T) and resistor $R_{B1}$. NTC resistor $R_{T1}$ (T) and resistor $R_{B1}$ determine the amount of bias current $I_{B1}(T)$ supplied to PIN diode 102 at a specific temperature. Bias current $I_{B1}(T)$ applied to PIN diode 42 creates a temperature dependent resistance $R_{D1}(T)$ across PIN diode 102.

Control circuit 100 may further comprise a inductor $L_1$ disposed between PIN diode 102 and resistor $R_{B1}$ for blocking any RF signal that may be present at control output 104. Control circuit further comprises a capacitor $C_1$ having one terminal coupled between resistor $R_{B1}$ and NTC resistor $R_{T1}(T)$ and a second terminal coupled to ground to create a short for any RF signal present.

The resistance of NTC resistor $R_{T1}(T)$ at a specific temperature T may be determined by equation 1.

$$R_{T1}(T) = C_T \cdot R_{ref} \quad \text{Eq. 1}$$

Resistance $R_{ref}$ is the resistance at a reference temperature, typically 25 degrees Celsius, and parameter $C_T$ is a curve parameter defined at temperature T and tabulated by the manufacture. Resistance $R_{ref}$ and the corresponding curve parameter determines the resistance over a broad range of temperatures. Equation 1 may be used to determine the value of NTC resistor $R_{T1}(T)$ so that an appropriate decrease in resistance at control output 104 may be realized at a temperature level T.

A resistance ratio, r, is used to determine the amount of bias current $I_{B1}(T)$ supplied to PIN diode 42 at a predetermined temperature level. The resistance ratio is the ratio between the resistance of a resistor at a power level and the resistance of the resistor at a reduced power level, for example, as a result of increased temperature levels. For example, if a RC circuit used in a RF power detector required a resistance of 20 Ohms to achieve an output power of 46.5 dBm and a resistance of 25 Ohms in order to achieve an output power of 46.0 dBm, then the resistance ratio, r, would equal 0.8. Once the required resistance ratio is defined, the value of resistor $R_{B1}$ can be determined by equation 2.

$$R_{B1} = \frac{R_{ref} \cdot r^{\frac{1}{k}} - R_{T1}(T)}{1 - r^{\frac{1}{k}}} \quad \text{Eq. 2}$$

Where resistance $R_{D1}(T)$ is the resistance across PIN diode 42 and A and k are the parameters of PIN diode 42 determined by the manufacturer. Bias current $I_{B1}(T)$ is the amount of DC current supplied to PIN diode 42 at a specific temperature T determined by equation 1 and 2. Temperature dependent resistance $R_{D1}$ across PIN diode 42 created by the application of bias current $I_{B1}(T)$ is illustrated in equation 3.

$$R_{D1}(T) = \left( \frac{A}{(I_{B1}(T))^k} \right)$$ Eq. 3

For example, using a Hewlett Packard PIN diode HSMP-3834 and a Thermometrics NTC resistor; k equals 0.9327, r equals 0.25 and reference resistance $R_{ref}$ equals 2252 Ohms. At a temperature T equals 70 degrees Celsius the curve parameter $C_T$ equals 0.1752 and NTC resistor $R_{T1}(T)$ equals 395 Ohms and resistor $R_{B1}$ equals 148 Ohms. If 150 Ohms is used for resistor $R_{B1}$, output resistance $R_{D1}(T)$ of bias control circuit 30 will decrease 4 times when the temperatures increases from 25 degrees Celsius to 70 degrees Celsius.

Figure 4:
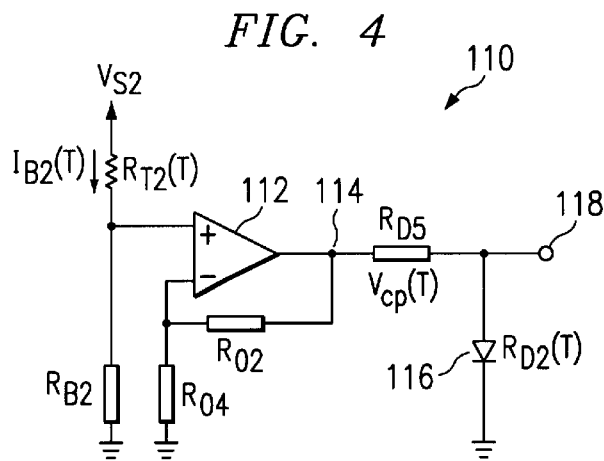
FIG. 4 is a control circuit according to an alternative embodiment of the invention.

Turning now to FIG. 4, where an alternative control circuit is illustrated and denoted generally as 110. Control circuit 110 comprises an operational amplifier 112 having a non-inverting input coupled to a voltage source $V_{S2}$ through a voltage divider and a inverting input coupled to an output terminal 114 containing a temperature dependent voltage $V_{OP}(T)$ through a resistor $R_{O3}$. The voltage divider comprises a Negative Temperature Coefficient (NTC) resistor $R_{T2}(T)$ and a resistor $R_{B2}$ for providing varying resistance at different temperature levels. By varying the amount of resistance the amount of bias current $I_{B2}(T)$ can be changed over varying temperatures causing output voltage $V_{OP}(T)$ to vary with temperature as can be seen from equation 5.

$$V_{OP}(T) = \left( \frac{\frac{R_{O3}}{R_{O4}} + 1}{1 + \frac{R_{T2}(T)}{R_{B2}}} \right) \cdot V_{S2}$$ Eq. 5

Control circuit 110 further comprises a resistor $R_{O4}$ having one lead coupled to the inverting input of operational amplifier 112 and a second lead coupled to ground. Control circuit 110 further comprises a PIN diode 116 having a cathode coupled to ground and an anode coupled to output terminal 114 through a resistor $R_{O5}$. By applying output voltage $V_{OP}(T)$ across PIN diode 116 a temperature dependent resistance is created as can be seen from a control output 118.

The resistance of NTC resistor $R_{T2}(T)$ at a specific temperature T may be determined by equation 6.

$$R_{T2}(T) = C_T R_{ref}$$ Eq. 6

Resistance $R_{ref}$ is the resistance at a reference temperature, typically 25 degrees Celsius, and parameter $C_T$ is a curve parameter defined at temperature T and tabulated by the manufacture. Resistance $R_{ref}$ and the corresponding curve parameter defines the resistance over a broad range of temperatures. Equation 3 may be used to determine the value of NTC resistor $R_{T2}(T)$ so that an appropriate decrease in resistance $R_{D2}(T)$ at control output 118 may be realized at a temperature level T.

Figure 5:
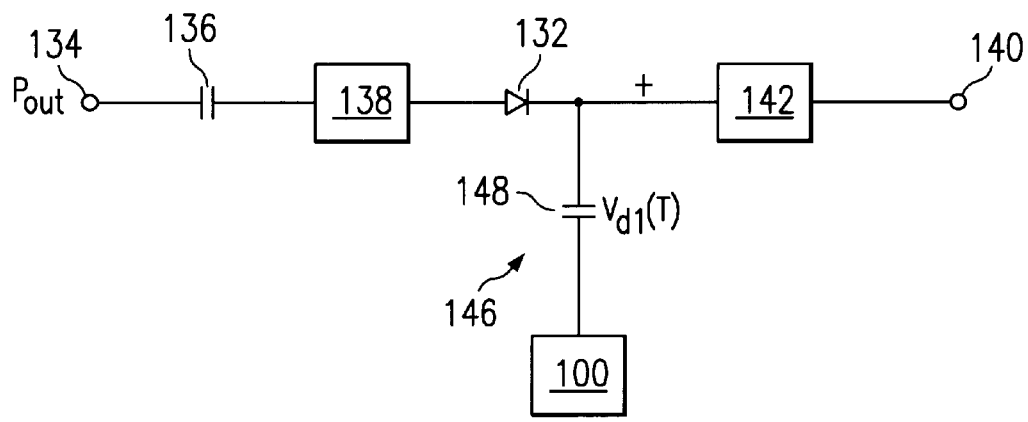
FIG. 5 is a compensated RF power detector according to an embodiment of the invention.

Turning now to FIG. 5, where a compensated RF power detector is illustrated and denoted generally as 130. Compensated RF power detector 130 comprises a detecting diode 132 for detecting RF input power $P_{in}$ coupled to a detector input 134 containing RF input power $P_{in}$ through a coupling capacitor 136 and a input matching circuit 138. Compensated RF power detector 130 further comprises detecting diode 132 coupled to a detector output 140 through a lineariser 142. Although compensated RF power detector 130 as illustrated utilizes lineariser 142, those of skill in the art will appreciate that detector circuit may also include a lineariser having a compensation circuit, such as a temperature compensation circuitry. Compensated RF power detector 130 further comprises a variable RC circuit 146 comprising a capacitor 148 having a first lead coupled to the cathode of detecting diode 32 and a second lead coupled in series to control output 104 of control circuit 100.

Compensated RF power detector 130 comprises a RF power detector having the resistor of the RC circuit replaced by control circuit 100 to create at extreme temperature conditions a temperature dependent detected signal $V_{d1}(T)$ across variable RC circuit 146. Although compensated RF power detector 130 is illustrated and is discussed with reference to control circuit 100, compensated RF power detector 130 may utilize either control circuit 100 or 110.

Figure 6:
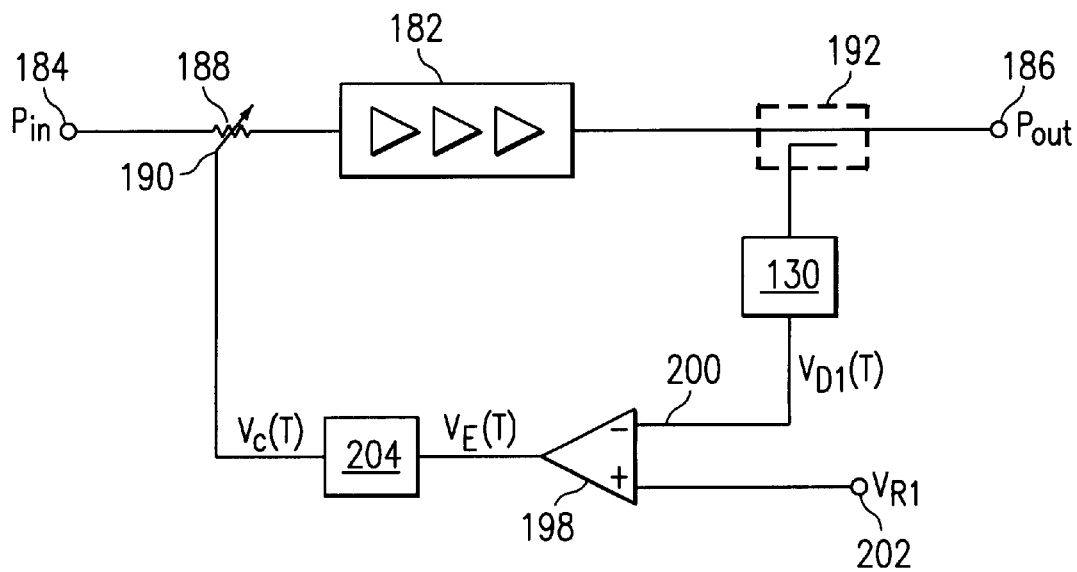
FIG. 6 is a power control loop utilizing the compensated RF power detector according to an embodiment of the invention.

Turning now to FIG. 6, where a Power Control Loop (PCL) utilizing compensated RF power detector 130 is illustrated and denoted generally 180. A Power Amplifier (PA) 182 is coupled to a RF input 184 for receiving RF input power $P_{in}$ and a RF output 186 for supplying a linearly amplified RF output power $P_{out}$. A variable attenuator 188 disposed between RF input 184 and PA 182 comprises a input coupled to RF input 184 and a output coupled to PA 182. Variable attenuator 188 further comprises a control signal input 190 for controlling the attenuation level at RF input 184.

A directional coupler 192 is coupled to RF output 186 for coupling a portion, $E_{O1}$, of output power Pout through the feedback path to compensated RF power detector 130. Compensated RF power detector 130 comprising a RF power detector coupled to a variable RC circuit 146 rectifies and linearises coupled power $E_{O1}$ to provide a detector output $V_{D1}(T)$. A comparator 198 having a inverting input 200 coupled to compensated RF power detector 130 containing detected output $V_{D1}(T)$ and a non-inverting input 202 containing a supplied reference signal $V_{R1}$. Supplied reference signal $V_{R1}$, may be supplied by an external source such as a Digital Signal Processor or Applications Specific Integrated Circuit (ASIC), represents the correct output power $P_{out}$. Comparator 198 compares detected signal $V_{D1}(T)$ and reference signal $V_{R1}$ and supplies a error signal $V_E(T)$ which is filtered through a loop filter 36. The filtered signal, a control signal $V_C(T)$, adjusts the attenuation level correcting the operating point to compensate for a decrease in the 1 dB gain compression point due to extreme temperature conditions.

PCL 180 uses negative feedback to control the gain of PA 182 so that PA 182 ramps up, transmits and ramps down within the specified time with minimum distortion. Error signal $V_E(T)$ is used to adjust the operating point so that PA 182 operates as efficiently as possible across all temperature ranges. Variable RC circuit 146 helps flatten the frequency response of the RF power detector. By reducing frequency response of the RF power detector a reduction in errors at the RF output can be realized.

While this invention has been described with reference to particular embodiments, this description is not intended to be limiting. Various modifications and combinations of the illustrative embodiments, as well as other embodiments of the invention, will be apparent to persons skilled in the art. It is, therefore, intended that the appended claims encompass any such modifications or embodiments.

What is claimed:

1. A compensated RF power detector comprising:
   a RF power detector having a RF input for receiving RF power, a detector output for supplying a compensated detected voltage, a detecting diode for generating a detected voltage in response to received RF power, said detecting diode having a anode coupled to said RF input and a cathode coupled to said detector output; and
   a variable RC circuit comprising a capacitor and a control circuit, said capacitor having a first lead coupled to said cathode of said detecting diode and a second lead coupled to said control circuit, said control circuit having a control output containing a temperature dependent resistance coupled to said second lead of said capacitor.

2. The compensated RF power detector as recited in claim 1, wherein said RF power detector further comprises:
   a coupling capacitor having a first lead coupled to said RF input and a second lead coupled to said anode of said detecting diode;
   a input matching circuit disposed between said coupling capacitor and said detecting diode;
   a linearizer disposed between said detecting diode and said RF output; and
   a bias voltage source coupled to said detecting diode through a resistor and said input matching circuit.

3. The compensated RF power detector as recited in claim 1, wherein said control circuit further comprises;
   a PIN diode having a anode and a cathode, said cathode of said PIN diode coupled to a ground potential and said anode of said PIN diode coupled to said control output, said PIN diode generating said variable resistance at said control output;
   a bias voltage source coupled to said anode of said PIN diode for supplying a bias current; and
   a temperature dependent resistor disposed between said PIN diode and said bias voltage source and having a first lead coupled to said bias voltage source and a second lead coupled to said anode of said PIN diode, the resistance of temperature dependent resistor varying across different temperatures affecting the amount of said bias current supplied to said PIN diode.

4. The compensated RF power detector according to claim 3, wherein said control circuit further comprises;
   a resistor disposed between said temperature dependent resistor and said PIN diode;
   a capacitor having a first terminal coupled to ground potential and a second terminal coupled between said resistor and said temperature dependent resistor; and
   a inductor disposed between said resistor and said anode of said PIN diode.

5. The compensated RF power detector according to claim 1, wherein said control circuit further comprises;
   a PIN diode having a cathode coupled to ground and a anode coupled to said control output, said PIN diode generating said variable resistance at said control output;
   a bias voltage source for biasing the diode;
   a operational amplifier having a output containing a temperature dependent voltage, said output of said operational amplifier coupled to said anode of said PIN diode through a second resistor, said operational amplifier having a non-inverting input coupled to said bias voltage source through a temperature dependent voltage divider and a inverting input coupled to said temperature dependent output through a third resistor and to ground potential through a fourth resistor.

6. The operational amplifier according to claim 5, wherein said temperature dependent voltage divider further comprises;
   a temperature dependent resistor having a first lead coupled to said bias voltage source and a second lead coupled to said inverting input; and
   a resistor coupled from a ground potential to the second lead of temperature dependent resistor.

7. A control circuit having a control output with a variable resistance, said control circuit comprising;
   a Pin diode having a cathode coupled to a ground potential and a anode coupled to said control output, said PIN diode generating said variable resistance at said control output;
   a bias voltage source for biasing the diode;
   a operational amplifier having a output containing a temperature dependent voltage, said output of said operational amplifier coupled to said anode of said PIN diode through a second resistor, a non-inverting input coupled to said bias voltage source through a temperature dependent voltage divider, the temperature dependent voltage divider having a temperature dependent resistor, and a inverting input coupled to said temperature dependent output through a third resistor and to ground potential through a fourth resistor.

8. A power control loop comprising:
   a power amplifier having an amplifier input and an amplifier output;
   a RF input for receiving RF power, said RF input coupled to said power amplifier;
   a variable attenuator disposed between the RF input and the power amplifier, the variable attenuator having a control signal input;
   a RF output coupled to said amplifier output, said RF output containing a linearly amplified signal;
   a directional coupler coupled to the amplifier output;
   a compensated RF power detector, said compensated RF power detector having a detector input and a detector output, said detector input coupled to said directional coupler, said detector output containing a temperature dependent detected voltage;
   a variable RC circuit comprising a control circuit for providing temperature dependent resistance and a capacitive element coupled to said compensated RF power detector;
   a supplied reference terminal containing a supplied reference voltage, said supplied reference voltage defining a correct measure of said linearly amplified signal;
   a comparator having a first input, a second input and a output, said first input coupled to said detector output, said second input coupled to said supplied reference terminal, said output containing an error signal; and
   a loop filter having an input and an output, said input coupled to said output of said comparator, said loop filter filters said error signal and supplies said control signal to said control signal input.

* * * * *